United States Patent [19]
Patterson et al.

[11] Patent Number: 4,753,354
[45] Date of Patent: Jun. 28, 1988

[54] SELF-ADJUSTING RACK ADAPTER

[75] Inventors: Patrick D. Patterson, Redwood City; Van L. Langston, Santa Clara, both of Calif.

[73] Assignee: Ford Aerospace & Communications Corp., Detroit, Mich.

[21] Appl. No.: 33,967

[22] Filed: Apr. 2, 1987

[51] Int. Cl.⁴ ............................................. A47F 5/00
[52] U.S. Cl. ..................................... 211/26; 211/182; 211/190; 211/207; 403/110; 403/405.1
[58] Field of Search .................. 248/245; 211/26, 182, 211/207, 190, 187; 403/110, 405, 187, 188, 193, 195

[56] References Cited

U.S. PATENT DOCUMENTS

| | | |
|---|---|---|
| 2,767,951 | 10/1956 | Cousino . |
| 3,188,037 | 6/1965 | Hinrichs ........................... 211/182 X |
| 3,388,809 | 6/1968 | Irish . |
| 3,826,207 | 7/1974 | Sutherlan . |
| 3,847,489 | 11/1974 | Van Riper . |
| 4,212,445 | 7/1980 | Hagen . |
| 4,614,273 | 9/1986 | Ishii ................................. 211/207 X |

FOREIGN PATENT DOCUMENTS 29845 12/1958 Finland ................................. 211/26

Primary Examiner—Robert W. Gibson, Jr.
Attorney, Agent, or Firm—Keith L. Zerschling; Edward J. Radlo; Kenneth R. Allen

[57] ABSTRACT

An adapter which comprises a pre-manufactured assembly capable of infinite vertical adjustment and self-adjusting width capability. To this end, the adapter of the present invention comprises a two-part unit in which the two parts thereof are relatively shiftable widthwise of the rack, yet a first of the parts is telescoped within the second part and secured by screws to the adjacent side of the chassis unit to be mounted. The second part of the adapter can be snap-fitted into the central, hollow portion of a vertical rail of the rack and normally remains stationary with respect to such rail; whereas, the first part of the adapter can be inserted into the second part before the second part is inserted into the hollow center portion of the rail.

25 Claims, 3 Drawing Sheets

SELF-ADJUSTING RACK ADAPTER

This invention relates to improvement in the mounting of electronic chassis units of various heights and widths into electronic equipment racks.

BACKGROUND OF THE INVENTION

It is well known to mount electronic chassis units in racks in which the chassis units are in stacked relationship and are attached to the vertical rails at the four corners of the racks. Because all chassis units are not exactly the same width, it sometimes becomes difficult to mount such chassis units on the vertical rails of a rack. The width variations are sometimes small and sometimes relatively large.

In the case of large width variations, a previous technique for attaching the chassis units to the rails of the rack has required complex brackets, hardware and custom milled spacers or shims for each type or size of chassis units. This technique has proven to be very costly in engineering, manufacturing and installation time. Two or more workmen can spend several hours just to install a single chassis unit in a rack because the dimensional variations of the chassis unit can require a considerable amount of machining time to make spacers or brackets so that the chassis unit can be safely and reliably attached to the rails of the rack. Because of these drawbacks, a need exists for an improved means and technique for securing electronic chassis units of the type described to racks to compensate for width variations in the chassis units while providing for infinite vertical adjustment of the chassis units on the racks. The present invention satisfies this need.

SUMMARY OF THE INVENTION

The present invention provides an adapter which comprises a pre-manufactured assembly capable of infinite vertical adjustment and self-adjusting width capability. To this end, the adapter of the present invention comprises a two-part unit in which the two parts thereof are relatively shiftable widthwise of the rack, yet a first of the parts is telescoped within the second part and secured by screws to the adjacent side of the chassis unit to be mounted. The second part of the adapter can be snap-fitted into the central, hollow portion of a vertical rail of the rack and normally remains stationary with respect to such rail; whereas, the first part of the adapter can be inserted into the second part before the second part is inserted into the hollow center portion of the rail.

The first part projects through a side slot in the second part and the first part can move laterally into and partially out of the second part widthwise of the rail. In this way, the first part can be attached by screws or other attachment devices to the electronic chassis unit to be mounted and the first part can be adjusted to span the distance between the chassis unit and the second part the width of the chassis unit differs from an average value. In this way, the second part allows the first part to be self adjusting to meet the requirements of the width variations of the chassis unit.

All of the foregoing can be achieved notwithstanding the fact that the adapter is infinitely adjustable in the vertical direction inasmuch as the second part of the adapter can move within and longitudinally of the rail on which it is mounted. With adapters in the rails at the four corners of a rack, the adapters can be coupled at four locations to the adjacent, respective sides of the chassis unit to be mounted, and the self adjustability of each adapter permits the slide bars at the opposed sides of the chassis unit to be shiftably attached to the first parts of the four adapters, whereupon the chassis unit will be properly mounted notwithstanding its variations in width from an average width for a particular type of chassis unit.

The present invention provides an improved adapter for attaching an electronic chassis unit to a rack, wherein the adapter is self-adjusting widthwise of the rack and is infinitely adjustable in the vertical direction so that a chassis unit can be quickly and easily mounted on a rack using the adapter so as to avoid the time, effort and expense in mounting such a chassis unit using conventional techniques.

The present invention also provides an improved adapter of the type described wherein the adapter is provided with a pair of relatively shiftable parts which can expand or contract depending upon the dimensional characteristics of a chassis unit to be mounted so that the adapter can be self-adjusting in the widthwise direction and be operable to cooperate with several other such adapters to mount a chassis unit on a rack quickly and easily and without the expenditure of time and effort now required with conventional mounting means.

The invention will be better understood with reference to the following detailed description of specific embodiment and the accompanying drawings.

DESCRIPTION OF SPECIFIC EMBODIMENTS

Figure 1:
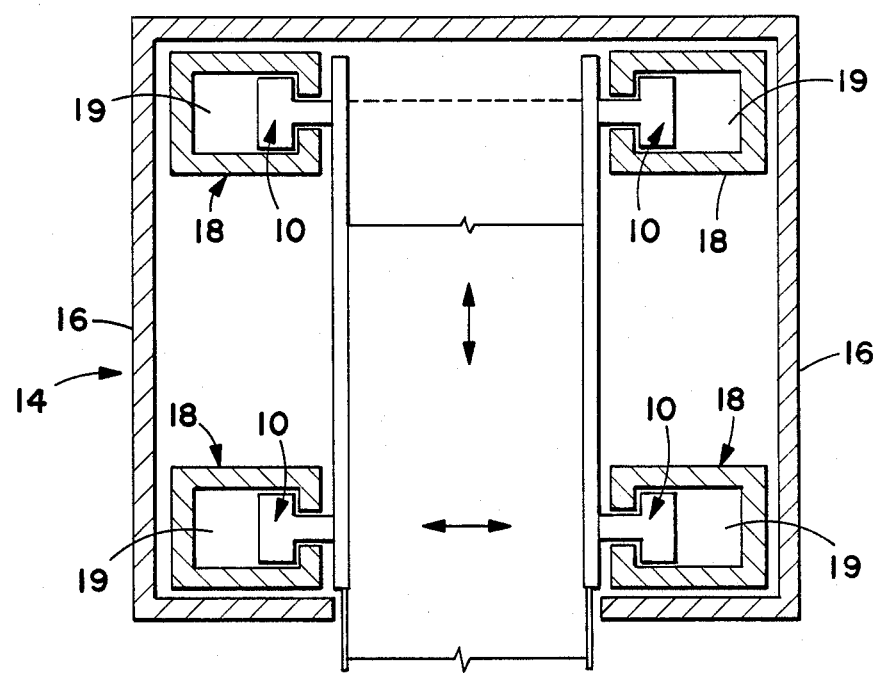
FIG. 1 is a top plan view of a electronic equipment rack having a chassis unit mounted thereon.

The present invention is directed to an improved adapter 10 for use with other such adapters 10 for mounting a chassis unit 12 on a rack 14 having an outer housing 16 and four vertical mounting rails 18 (FIGS. 1 and 2) generally at the corners of the housing 16. The housing 16 and rails 18 are conventional in construction and they extend upwardly to a certain height, such as four to six feet above floor level. They are adapted to mount a number of chassis units 12 in vertically stacked relationship as shown in FIG. 2. Typically, there may be as many as five to ten chassis units 12 mounted on rack 14 as desired or needed, depending upon the heights of the various chassis units. Moreover, dummy mounting plates 13 can be used to cover the open spaces between adjacent chassis units 12 as needed.

Figure 2:
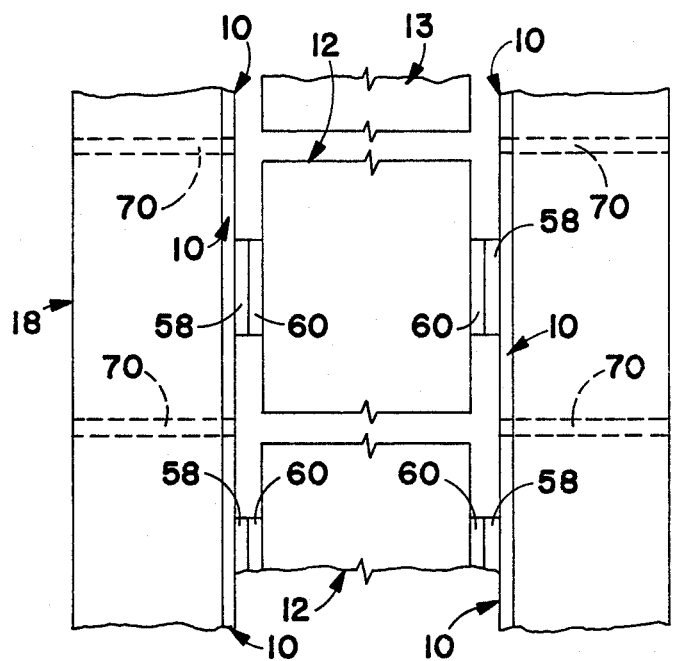
FIG. 2 is a fragmentary, front elevational view of the rack of FIG. 1, showing a pair of chassis units mounted in vertically spaced relationships with respect to each other.
Figure 3:
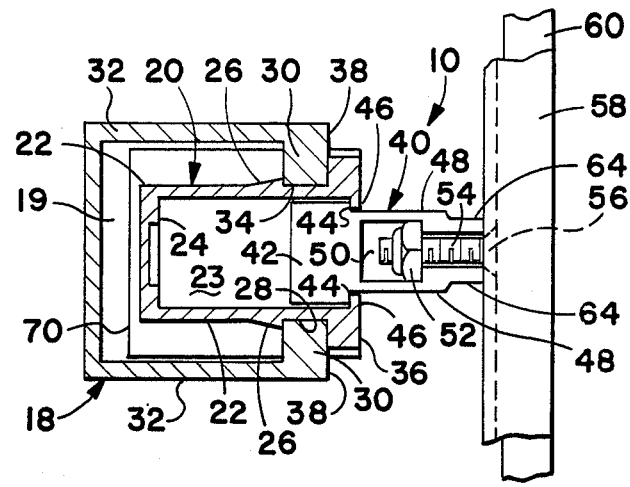
FIG. 3 is an enlarged, horizontal section through the adapter of the present invention for mounting one side of a chassis unit on the rack of FIGS. 1 and 2.

Each of the mounting rails 18 is generally C-shaped in cross-section as shown in FIGS. 1 and 3. To this end, the interior of each mounting rail 18 is hollow to present an empty space 19 for receiving one part 20 of the corresponding adapter 10 which is the subject of the present invention. Part 20 is typically of a length of about the same as the height of the chassis unit 12 to be coupled to rack 14. Also, part 20 is U-shaped in cross-section to present a pair of sides 22 which are generally parallel with each other and are integral with an inner end wall 24 (FIG. 3). The outer surface of each side 20 is provided with a transversely triangular, longitudinally extending rib 26 which forms with a flange 36 a recess 28 for receiving the longitudinal flanges 30 of rail 18 which extend inwardly toward each other and are integral with the sides 32 of the rail. Sides 22 of part 20 are slightly yieldable so that they can be forced inwardly towards each other when part 20 is forced into the slot 34 between the interfaces of flanges 30. Sides 22 of part 20 have outer flanges 36 which extend along the outer faces 38 of flanges 30 when the flanges 30 are seated in recesses 28 as shown in FIG. 3.

A second part 40 of adapter 10 cooperates with first part 20 and is shiftably coupled to part 20. Second part 40 has an elongated, inner boss 42 which is slidably received within the interior space 23 of part 20 as defined by sides 22 and end wall 24. Boss 42 has a shoulder 44 which butts up against the inwardly extending lips 46 of the adjacent flanges 36 as shown in FIG. 3. This feature retains boss 42 in the space 23 yet allows the boss to be inserted into part 20 from one open end of space 23.

Second part 40 has a pair of sides 48 (FIG. 3) which are spaced apart and have an enlarged space 50 for receiving at least a pair of hex nut 52 fitted on the inner ends of respective screws 54, each screw having a flat head 56 (FIGS. 3–5) carried in a hole 57 (FIG. 5) of a slide bar 58. The flats of nuts 52 bear against the inner surfaces of sides 48 so that the nuts are captured and the screws 54 can be rotated to rigidly attach slide bar 58 to part 40. When so attached, the slide bar can move toward and away from first part 20 because of the shiftability of part 40 relative to part 20. Thus, slide bar 58 can be accommodated as to the width of the chassis unit 12 which is to be mounted on the rack by the corresponding adapter 10.

A shiftable bar 60 associated with slide bar 58 is movable relative to and longitudinally of slide bar 58. Moreover, movable bar 60 is secured to conventional hooks or other fasteners to the side of a chassis unit 12 to couple the chassis unit to the bar 58. As shown in FIG. 3, second part 40 floats in first part 20 inasmuch as the second part 40 can be moved into and remain in any position in first part 20. In the alternative, a coil spring 66 (FIGS. 4 and 5) can be used to bias second part 40 in a direction to the right when viewing FIG. 3, if desired. The spring is not necessary but it is sometimes desirable to position the outer end of second part 40 sufficiently far out to accommodate a relatively narrow chassis unit 12. Part 40 can typically move about one inch relative to and transversely of part 20.

Figure 5:
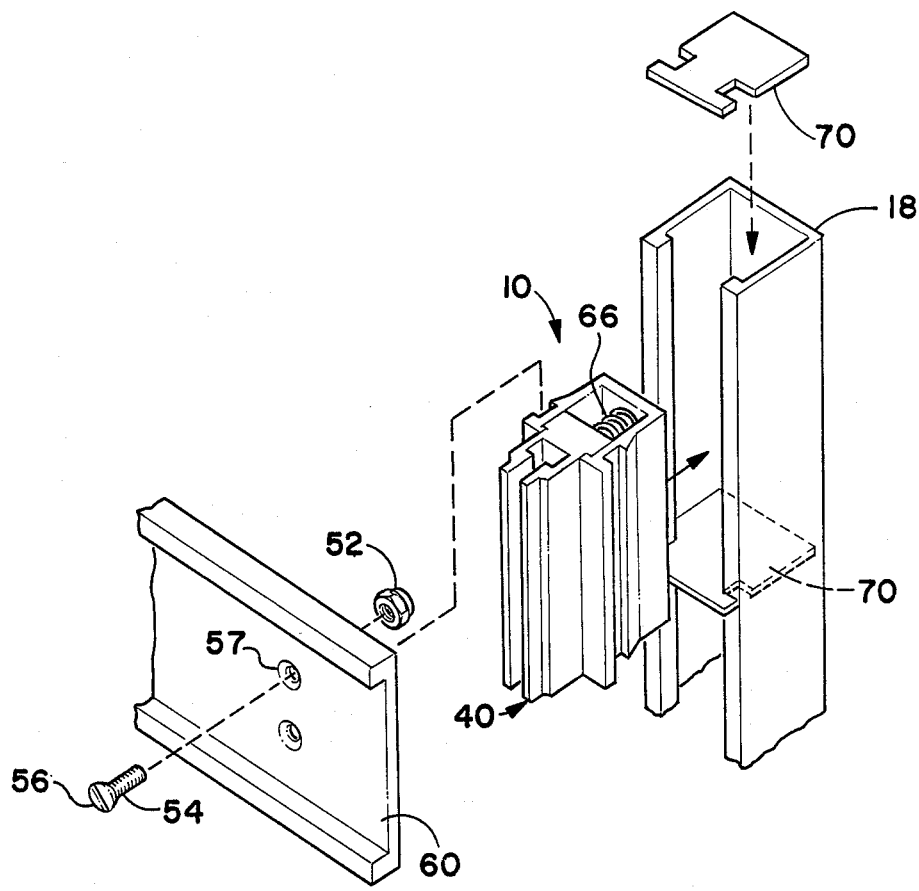
FIG. 5 is a perspective view of the adapter of the present invention showing the way in which it is received in the open, inner side of the corresponding rail of the rack of FIGS. 1 and 2.

As shown in FIG. 5, both first part 20 and second part 40 have open, outer, longitudinally extending slots. The slot of part 20 is defined by lips 46 and the slot of second part 40 is defined by the outer ends of sides 48. The slot of second part 40 receives screws 54; thus, no drilling of holes is required in second part 40. Moreover, the cross-sectional configurations of first and second parts 20 and 40 are such that can be formed by an extrusion process to simplify their construction as well as to minimize their production cost.

The sides 48 of second part 40 have a reduced width as defined by the undercut portions 64 (FIG. 3). This feature allows the first and second parts as a unit to be forced into the interior of the corresponding vertical mounting rail 18 because, when part 40 is fully within part 20, sides 22 of part 20 can yield inwardly sufficiently far to allow flanges 30 be moved into recesses 28. This feature requires that portions 64 be adjacent to lips 46 of flanges 36 of first part 20 so that the sides 22 of the first part 20 can yield inwardly to allow projections 26 to pass into the interior of the corresponding rail 18.

When it is desired to use adapter 10 for mounting chassis unit 12 on rack 14, a pair of adapters 10 are first selected in height to accommodate the height of the corresponding chassis unit 12. Parts 20 and 40 are cut from stock material to the proper length and the length of part 40 is substantially the same as the length of part 20. The slide member 58 is also cut to a predetermined length from stock material so that it will extend the distance from one mounting rail 18 to the other as shown in FIG. 1. Then, screws 54 are placed through holes 57 in rails 58 and nuts 52 are threaded onto screws 54 to rigidly secure slide bar 58 to second part 40, the latter being inserted into first part 20.

Figure 4:
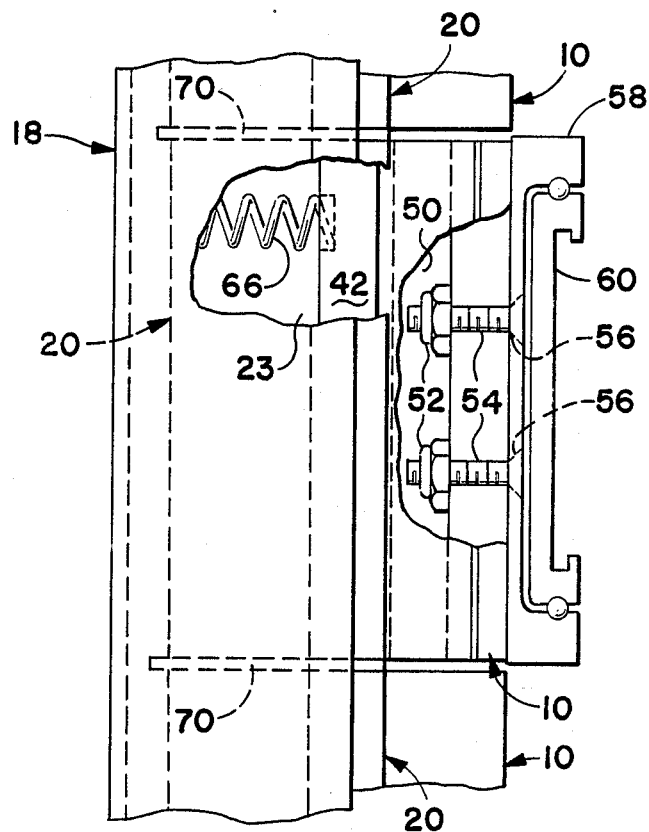
FIG. 4 is a side elevational view, partly broken away and in section, of the adapter of the present invention mounted in a vertical rail forming a part of the rack of FIGS. 1 and 2.

With the second parts 40 of both adapters 10 in corresponding first parts 20 thereof, the first parts 20 are forced into the interiors of vertical mounting rails 18 (which serves only for positioning and carries no load) until flanges 30 are in recesses 28 as shown in FIG. 3. The adapters will rest on a spacer 70 as shown in FIG. 4 and FIG. 5, and the spacer 70 will be on the bottom of the rack or on the top of the next adapter 10 therebelow. Load is borne by the combination of first parts 20 and spacers 70 so that racks can be stacked essentially in indepently of loading. Thus the next adapter 10 below will be in load bearing relationship to the adapter 10 being installed in place. If the spacer 70 is removed, the stacking scheme fails.

The adapters for the opposite sides of the rack will then be installed in the same manner as I described above. In such a case, both slide bars 58 will be ready to receive shiftable bars 60 which can be readily connected to the hooks or fasteners on the opposite sides of a chassis unit 12 so that the chassis unit can be coupled to the slide bar 58.

Since slide bars 58 can be moved inwardly and outwardly (from right to left and left to right when viewing FIGS. 3 and 4), this feature compensates for errors in the widths of chassis units and allows quick interchangeability between chassis units of the same but of slightly different tolerances and widths. Thus, a great amount of time can be saved by mounting chassis units 12 using adapters 10 in connection with mounting rails 18, yet one chassis unit can be quickly and easily removed from the rack and another immediately inserted in its place without the use of shims, without the need for adjustments in the positions of the slide rails 58 and 60 and without the expenditure of long and tedious man-hours of labor.

Figure 6:
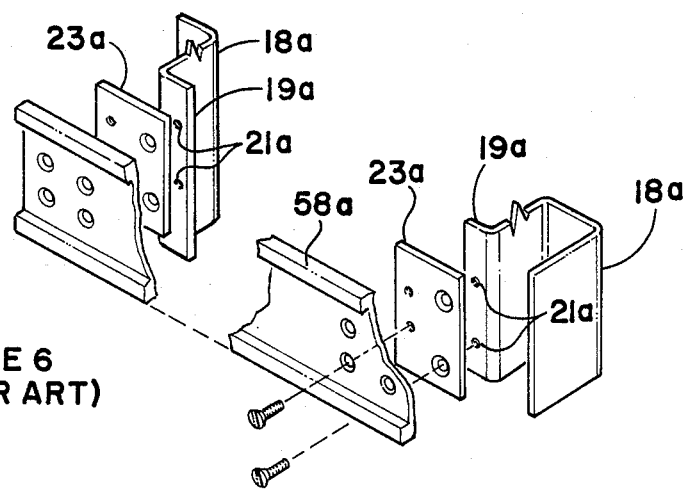
FIG. 6 is a view similar to FIG. 5 but showing a prior art chassis mounting means using machined shims for adjusting the chassis unit after it has been mounted on the rack of FIGS. 1 and 2.

The present invention is to be contrasted with the conventional way of mounting a slide bar 58a (FIG. 6) to vertical mounting rails 18a which require flanges 19a provided with tapped holes 21a for receiving screws which must be mounted on slide bar 58a after an passing through machined shims 23a. These shims must be accurately ground and machined so that they will properly place slide bar 58 inwardly or outwardly of the chassis unit to be mounted to accommodate itself to the errors in the width dimensions of the chassis unit. Moreover, when replacing one chassis unit 12 with another chassis unit of the same construction, different shims must be put in place because one chassis unit will have different width dimensions than another. All of this contributes greatly to the increase of man-hour expenditure of time and effort to mount a chassis unit to a rack in a conventional manner. All of these problems are clearly circumvented by the use of adapters of the present invention as described above.

We claim:

1. Apparatus for mounting a chassis unit on a rack having a vertical, hollow rail provided with a side slot comprising: an adapter having a pair of relatively shiftable parts, a first of the parts being telescopically received in a second of the parts, said second part having a side slot to allow said first part to project and move partially out of the second part, said second part adapted to be inserted into the rail through the side slot of the rail, said parts having means for limiting the outward movement of the first part relative to the second part, said second part having means for holding the second part in the rail; and means carried by the first part for attaching the first part to the side of a chassis unit to be mounted on the rail.

2. Apparatus as set forth in claim 1, wherein the second part has a pair of spaced sides, said sides being yieldable so that they can move toward each other to permit insertion of the second part into the rail through the side slot of the rail.

3. Apparatus as set forth in claim 2, wherein the sides of the second part are yieldable only when the first part is substantially fully received within the second part.

4. Apparatus as set forth in claim 1, wherein said holding means includes means defining a pair of spaced flanges on each side, respectively, of the second part, said spaced flanges being adapted to embrace a portion of the rail.

5. Apparatus as set forth in claim 1, wherein the first part is movable longitudinally of the second part, whereby the parts can be coupled together by inserting the first part into the second part through an open end of the second part.

6. Apparatus as set forth in claim 1, wherein said first part has a longitudinally extending side slot therein, the side slot of the first part having shoulder means internally of the first part, said attachment means including a screw extending into and through the side slot of the first part, and a nut within the side slot and threaded onto the screw, said nut engaging the shoulder means for holding the nut against movement out of the side slot of the first part.

7. Apparatus as set forth in claim 6, wherein the nut has flat sides thereon, said first part having a pair of spaced, inner surfaces which are parallel and flat to engage the flat surfaces of the nut to prevent rotation of the nut as the screw is rotated relative to the first part.

8. Apparatus for mounting a chassis unit on a rack having a number of spaced, vertical, hollow rails with each rail having a side slot comprising: an adapter for each rail respectively, each adapter having a pair of relatively shiftable parts, a first of the parts being telescopically received in a second of the parts and the second part having a side slot to allow the first part to project and to move partially out of the second part, said second part of each adapter adapted to be inserted into the respective rail through the side slot of the rail, said parts of each adapter having means for limiting the outward movement of the first part relative to the second part, said second part of each adapter having means for holding the second part in the corresponding rail and for allowing the first part of the adapter to move partially out of the second part and to project outwardly therefrom; and means carried by the first part of each adapter for attaching the first part to a respective location on the side of a chassis unit to be mounted on the rails.

9. Apparatus as set forth in claim 8, wherein each second part has a pair of spaced sides, said sides being yieldable so that they can move toward each other to permit insertion of the second part into the respective rail through the side slot of the rail.

10. Apparatus as set forth in claim 9, wherein the sides of each second part are yieldable only when the corresponding first part is substantially fully received within the second part.

11. Apparatus as set forth in claim 8, wherein said holding means for each adapter includes means defining a pair of spaced flanges on each side, respectively, of the corresponding second part, said spaced flanges being adapted to embrace a portion of the rail.

12. Apparatus as set forth in claim 8, wherein the first part of each adapter is movable longitudinally of the corresponding second part, whereby the parts can be coupled together by inserting the first part into the second part through an open end of the second part.

13. Apparatus as set forth in claim 8, wherein each first part has a longitudinally extending side slot therein, the side slot of the first part having shoulder means internally of the first part, said attachment means for each adapter including a screw extending into and through the side slot of the first part, and a nut within the side slot and threaded onto the screw, said nut engaging the shoulder means for holding the nut against movement out of the side slot of the first part.

14. Apparatus as set forth in claim 13, wherein each nut has flat sides thereon, each first part having a pair of spaced, inner surfaces which are parallel and flat to engage the flat surfaces of the corresponding nut to prevent rotation of the nut as the screw is rotated relative to the first part.

15. Apparatus for mounting a chassis unit comprising: a rack having a number of vertical, hollow rails with each rail having a side slot facing the space for receiving a chassis unit; an adapter for each rail respectively, each adapter having a pair of relatively shiftable parts, a first of the parts of each adapter being telescopically received in a second of the parts, said second part of each adapter having a side slot to allow the first part of the adapter to project and move partially out of the second part, said second part of each adapter being insertable into the respective rail through the side slot of the rail, said parts having means for limiting the outward movement of the first part relative to the second part, said second part of each adapter having means for holding the second part into the rail to prevent removal of the second part from the rail through the side slot of the rail; and means carried by the first part of each adapter for attaching the first part to an attachment location on a respective side of a chassis unit to be mounted on the rails.

16. Apparatus as set forth in claim 15, wherein the second part of each adapter has a pair of spaced sides, said sides being yieldable toward each other to permit insertion of the second part into the respective rail through the side slot of the rail.

17. Apparatus as set forth in claim 16, wherein the sides of the second part of each adapter are yieldable only when the first part of the adapter is substantially fully received within the second part of the adapter.

18. Apparatus as set forth in claim 15, wherein said holding means of each adapter includes means defining a pair of spaced flanges on each side respectively of the second part of each adapter, said spaced flanges being adapted to embrace a portion of a respective rail.

19. Apparatus as set forth in claim 15, wherein the first part of each adapter is movable longitudinally of the second part of the adapter, whereby the parts can be coupled together by inserting the first part into the second through an open end of the second part.

20. Apparatus as set forth in claim 15, wherein the first part of each adapter has a longitudinally extending side slot therein, the side slot of the first part of each adapter having shoulder means internally of the first part, said attachment means including a screw extending into and through the side slot of the first part of each adapter, and a nut within the side slot of the first part of each adapter and fitted onto the screw, said nut engaging the shoulder means for holding the nut against movement out of the side slot of the first part of each adapter.

21. Apparatus as set forth in claim 20, wherein the nut has flat sides thereon, said first part having a pair of spaced, inner surfaces which are parallel and flat to engage the flat surfaces of the nut to prevent rotation of the nut as the screw is rotated relative to the first part.

22. Apparatus as set forth in claim 15, wherein said limiting means includes a pair of spaced projections extending into the side slot of each second part respectively, the corresponding first part having shoulder means for engaging the projection to limit the outward movement of the first part relative to the second part.

23. Apparatus as set forth in claim 22, wherein is included a spring within the second part and against the first part for biasing the first part in a direction out of the side slot of the second part.

24. Apparatus as set forth in claim 15, wherein is included a second set of adapters for mounting a second chassis unit above the chassis unit mounted by the first mentioned adapters, there being a second adapter above each first adapter, respectively, the first adapters being in load-bearing relationship to the second adapters thereabove.

25. Apparatus as set forth in claim 24, wherein is included a spacer between each pair of first and second adapters.

* * * * *